(12) United States Patent
Kato

(10) Patent No.: US 6,778,439 B2
(45) Date of Patent: Aug. 17, 2004

(54) NONVOLATILE SEMICONDUCTOR MEMORY DEVICE WITH MONOS TYPE MEMORY CELL

(75) Inventor: Hiroshi Kato, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 5 days.

(21) Appl. No.: 10/357,490

(22) Filed: Feb. 4, 2003

(65) Prior Publication Data

US 2004/0062080 A1 Apr. 1, 2004

(30) Foreign Application Priority Data

Oct. 1, 2002 (JP) .................................... 2002-288747

(51) Int. Cl.⁷ ............................................. G11C 16/06
(52) U.S. Cl. ............................ 365/185.21; 365/230.03
(58) Field of Search ........................ 365/185.21, 230.03

(56) References Cited

U.S. PATENT DOCUMENTS

| | | | |
|---|---|---|---|
| 4,173,766 A | 11/1979 | Hays | 257/315 |
| 4,173,791 A | 11/1979 | Bell | 365/178 |
| 5,768,192 A | 6/1998 | Eitan | 365/185.24 |
| 6,011,725 A | 1/2000 | Eitan | 365/185.33 |
| 6,314,044 B1 * | 11/2001 | Sasaki et al. | 365/230.03 |

FOREIGN PATENT DOCUMENTS

JP   5-136376   6/1993

OTHER PUBLICATIONS

Boaz Eitan et al., "Can NROM, a 2 bit, Trapping Storage NVM Cell, Give a Real Challenge to Floating Gate Cells?". The 1999 International Conference on Solid State Devices and Materials, Tokyo, Japan, Sep. 21–24, 1999, pp. 522–524.

U.S. patent application Ser. No. 10/146,021 filed May 16, 2002.

U.S. patent application Ser. No. 10/146,031 filed May 16, 2002.

U.S. patent application Ser. No. 10/211,338 filed Aug. 5, 2002.

U.S. patent application Ser. No. 10/216,729 filed Aug. 13, 2002.

U.S. patent application Ser. No. 10/330,093 filed Dec. 30, 2002.

U.S. patent application No. 10/222,865, filed Aug. 19, 2002.

U.S. patent application No. 10/319,520 filed Dec. 16, 2002.

U.S. patent application No. 10/326,141, filed Dec. 23, 2002.

U.S. patent application No. 10/298,666, filed Nov. 19, 2002.

U.S. patent application No. 10/302,963, filed Nov. 25, 2002.

* cited by examiner

Primary Examiner—M. Tran
(74) Attorney, Agent, or Firm—Burns, Doane, Swecker & Mathis, L.L.P.

(57) ABSTRACT

A memory block of this flash memory includes 64×8 MONOS type memory cells arranged in 64 rows and 8 columns, 64 word lines respectively provided corresponding to 64 rows, bit lines respectively provided corresponding to 8 columns, and a source line commonly provided to all the memory cells. Accordingly, since the MONOS type memory cell is utilized as a one bit/cell memory cell and a conventional array configuration is employed, the manufacturing process and the configuration can be simplified.

5 Claims, 13 Drawing Sheets

|  | SOURCE | DRAIN | GATE | SUBSTRATE |
|---|---|---|---|---|
| WRITE | 5V | 0V | 10V | 0V |
| ERASE | 10V | 0V | 0V | 0V |
| READ | 0V | 2V | 3V | 0V |

NONVOLATILE SEMICONDUCTOR MEMORY DEVICE WITH MONOS TYPE MEMORY CELL

BACKGROUND OF THE INVENTION

1. Field of the Invention

The present invention generally relates to a nonvolatile semiconductor memory device, and more particularly to a nonvolatile semiconductor memory device with an MONOS (Metal Oxide Nitride Oxide Semiconductor) type memory cell.

2. Description of the Background Art

An MONOS type flash EEPROM (Electrically Erasable Programmable Read Only Memory) is known as one type of flash EEPROMs which are nonvolatile semiconductor memory devices. In the MONOS type memory cell, an ONO ($SiO_2$—$Si_3N_4$—$SiO_2$) film exists between a control gate and the channel. In this memory cell, two bit data can be stored depending on whether or not electrons are trapped in each of the source side portion and the drain side portion of the $Si_3N_4$ layer. In addition, this memory cell has a simpler manufacturing process and is less expensive compared to a memory cell having a floating gate. Such a memory cell is disclosed, for example, in U.S. Pat. No. 6,011,725.

Furthermore, U.S. Pat. No. 4,173,791 discloses a configuration of an MNOS (Metal Nitride Oxide Semiconductor) type flash EEPROM memory array.

In this memory array, adjacent two memory cells in the same row share a bit line. This is because a direction of a current flowing through the channel need to be reversed between a reading operation and a writing operation, and because two bit data need to be stored in one memory cell.

However, when two bit data are to be stored in the MONOS type memory cell, a reduction in distance between the source side portion and the drain side portion of the $Si_3N_4$ layer is difficult to achieve, and consequently, the layout area becomes larger.

Furthermore, in the above-described memory array configuration, the following problems arise. That is, compared to a conventional memory array configuration in which a bit line is provided to each column, a voltage control of the bit line becomes more complicated, a bit line control circuit configuration increases in complexity, and a time period for design takes longer.

U.S. Pat. No. 4,173,791 mentioned above discloses an EEPROM in which a conventional memory array is configured of MNOS type memory cells trapping electrons in a gate insulator film. Different from the MONOS type memory cell, however, the MNOS type memory cell has no oxide film between a gate electrode and a nitride film. Accordingly, electrons trapped in the nitride film tend to be easily leaked into the gate electrode. Therefore, a data retention capability of the memory cell is low.

SUMMARY OF THE INVENTION

An object of the present invention is to provide a nonvolatile semiconductor memory device with a simple manufacturing process, a high data retention capability, a small layout area, and a simplified configuration.

A nonvolatile semiconductor memory device in accordance with the present invention includes a plurality of memory cells arranged in a plurality of rows and a plurality of columns, each including a semiconductor substrate, a first insulator layer, a charge trapping layer, a second insulator layer, and a gate electrode successively stacked on a surface of the semiconductor substrate, and the source and the drain respectively formed on the surface of the semiconductor substrate at one side and the other side of the gate electrode. The nonvolatile semiconductor memory device further includes a plurality of word lines respectively provided corresponding to the plurality of rows, each being connected to the gate electrode of each corresponding memory cell. The nonvolatile semiconductor memory device further includes a plurality of bit lines respectively provided corresponding to the plurality of columns, each being connected to the drain of each corresponding memory cell. The nonvolatile semiconductor memory device further includes a source line commonly connected to the sources of the plurality of memory cells, and a read circuit selecting any of the plurality of memory cells in accordance with an address signal and reading a data signal of the selected memory cell. The read circuit includes a first word line drive circuit applying a predetermined first potential to a word line corresponding to the selected memory cell while applying a ground potential to other word lines, a first bit line drive circuit applying a predetermined second potential to a bit line corresponding to the selected memory cell while applying the ground potential to other bit lines, a first source line drive circuit applying the ground potential to a source line, and a current detection circuit detecting whether or not a current flows in the bit line corresponding to the selected memory cell and outputting the data signal at a level corresponding to a detection result. Accordingly, since the MONOS type memory cell is utilized, a simplification of the manufacturing process and an improvement in the data retention capability can be achieved. In addition, the MONOS type memory cell is utilized to make a conventional memory array and it is used as a one bit/cell-memory cell. Accordingly, a reduction in the layout area and simplification of the configuration are possible. Furthermore, since the read circuit is composed of the first word line drive circuit, the first bit line drive circuit, the first source line drive circuit, and the current detection circuit, reading the data signal can be performed easily and accurately.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In general, high integration of a memory array is of highest priority in a semiconductor memory. In a logic embedded memory, however, a simplification of a manufacturing process is regarded as more important than high integration. A memory capacity of the logic embedded memory is not very large. Naturally, high integration of the general purpose memory gains higher priority than that of the logic embedded memory. Accordingly, it will be a great advantage that the manufacturing process of an MONOS type memory cell is simpler than that of a floating gate type memory cell. Therefore, the present invention provides an MONOS type flash memory in which the manufacturing process and the configuration are simplified by utilizing the MONOS type memory cell as a one bit/cell-memory cell and employing a conventional array configuration.

Figure 1:
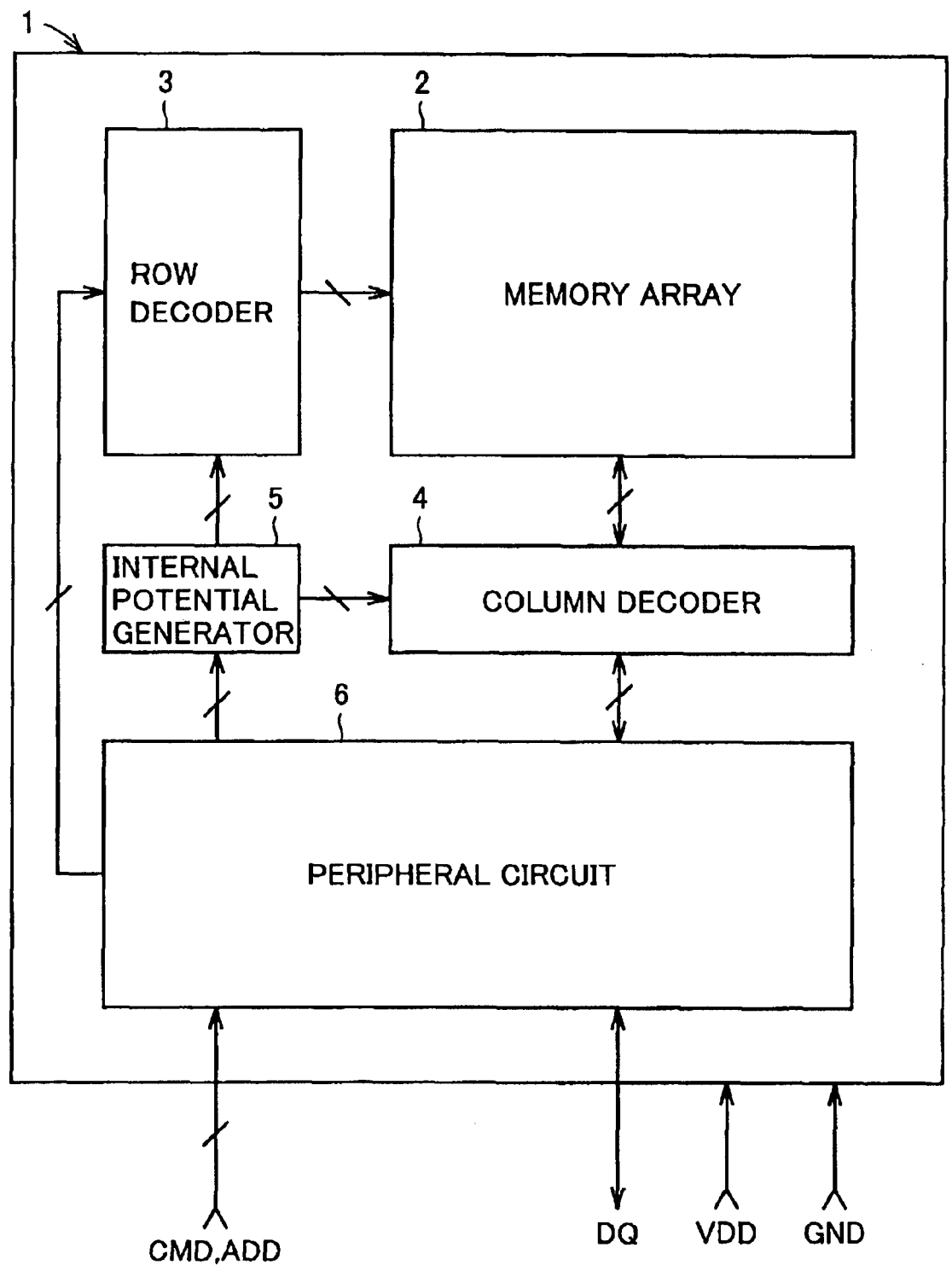
FIG. 1 is a block diagram illustrating an overall configuration of an MONOS type flash memory in accordance with one embodiment of the present invention.

FIG. 1 is a block diagram showing an overall configuration of an MONOS type flash memory 1 in accordance with one embodiment of the present invention. In FIG. 1, this flash memory 1 includes a memory array 2, a row decoder 3, a column decoder 4, an internal potential generator 5, and a peripheral circuit 6.

Figure 2:
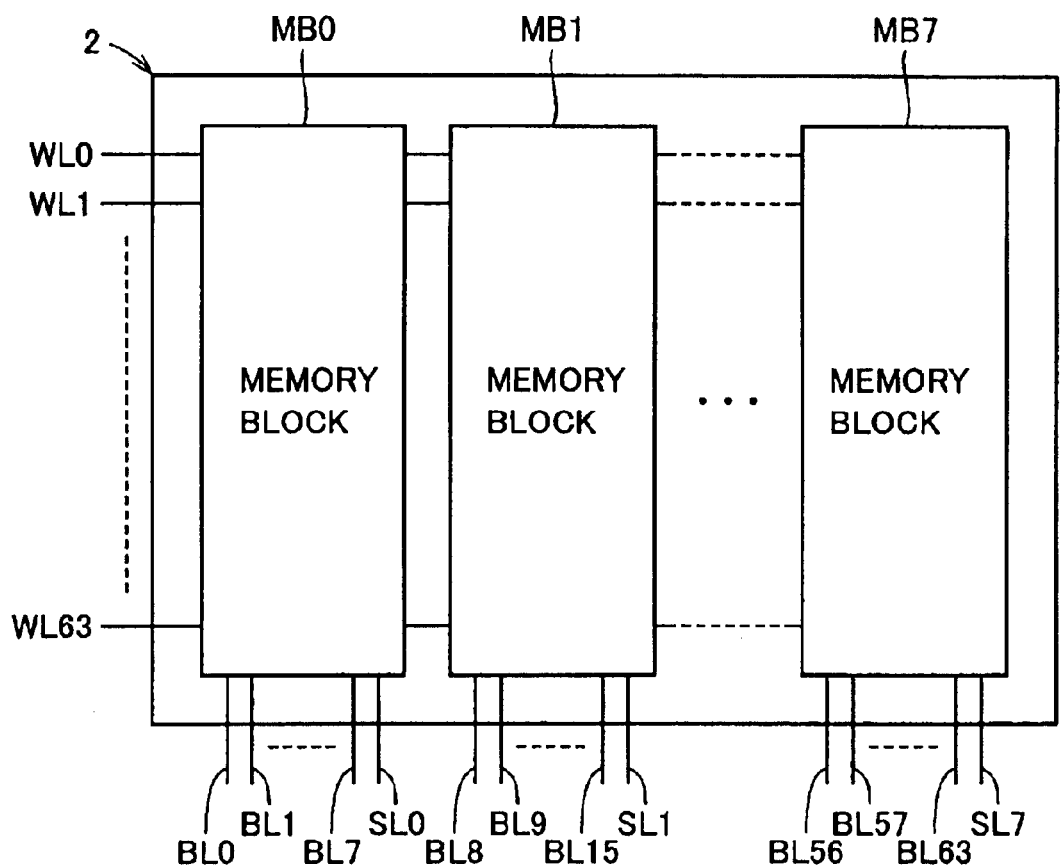
FIG. 2 is a block diagram illustrating a configuration of a memory array shown in FIG. 1.

As shown in FIG. 2, memory array 2 includes 8 memory blocks MB0 to MB7. Memory blocks MB0 to MB7 are commonly provided with 64 word lines WL0 to WL63. Memory blocks MB0 to MB7 are respectively provided with bit lines BL0 to BL7, ..., BL56 to BL63. Memory blocks MB0 to MB7 are provided with source lines SL0 to SL7.

Figure 3:
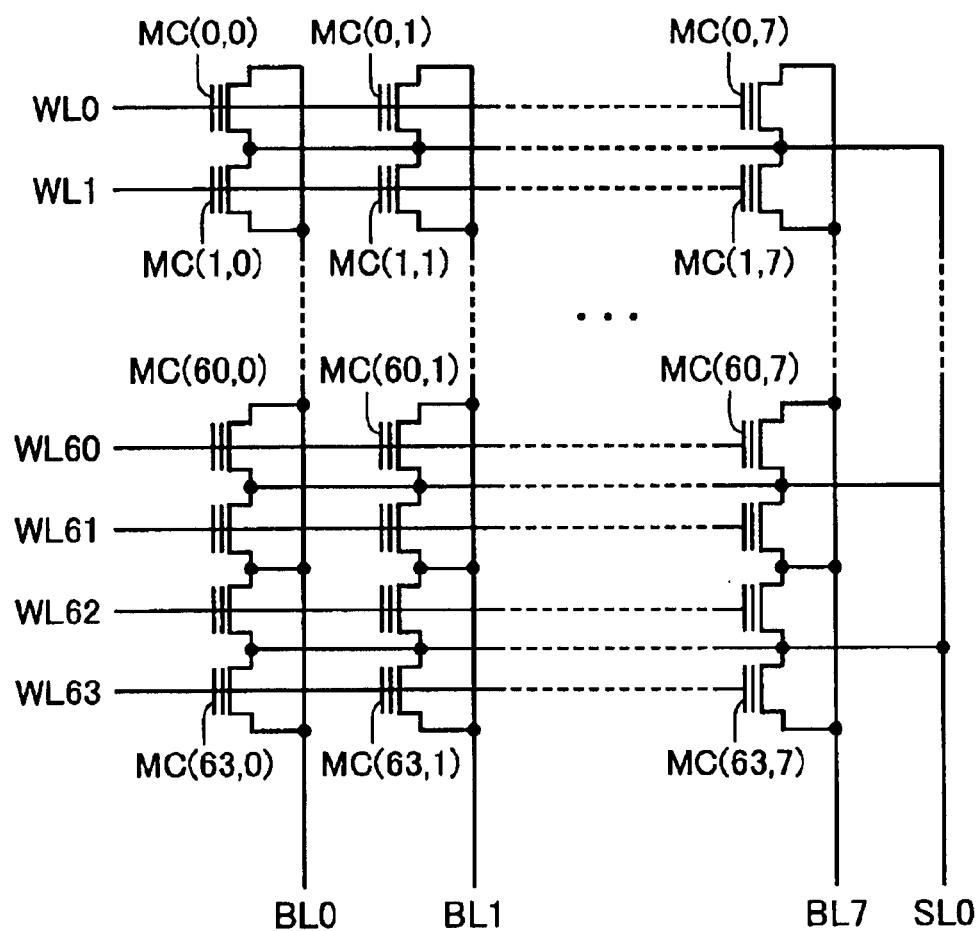
FIG. 3 is a circuit diagram illustrating a configuration of a memory block shown in FIG. 2.

As shown in FIG. 3, memory block MB0 includes 64×8 memory cells MC (0, 0) to MC (63, 7) arranged in 64 rows and 8 columns. Each memory cell MC is the MONOS type memory cell and stores a one bit data signal here. The gate of each memory cell MC is connected to a corresponding word line WL, the drain thereof is connected to a corresponding bit line BL, and the source thereof is connected to source line SL0. Each of the other memory blocks MB1 to MB7 has the same configuration as in memory block MB0.

Figures 4, 5:
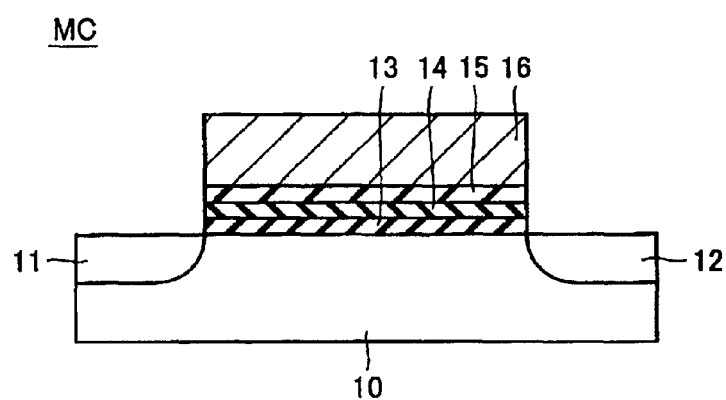
FIG. 4 is a cross-sectional view illustrating a configuration of a memory cell shown in FIG. 3.
FIG. 5 is a diagram showing an operation of the memory cell shown in FIG. 4.

FIG. 4 is a cross-sectional view showing a configuration of memory cell MC. In FIG. 4, this memory cell MC includes a P type semiconductor substrate 10, an $SiO_2$ film 13, an $Si_3N_4$ film 14, an $SiO_2$ film 15, and a gate electrode 16, successively stacked on a surface of the semiconductor substrate 10. On one side and the other side thereof, an N type impurity is implanted to the surface of P type semiconductor substrate 10 to respectively form source 11 and drain 12.

In a writing operation, as shown in upper boxes of FIG. 5, 5V, 0V, 10 V, and 0V are respectively applied to source 11, drain 12, gate electrode 16, and substrate 10. As a result, electrons flow from drain 12 to source 11, some of the electrons are trapped in $Si_3N_4$ film 14 near source 11 as channel hot electrons, and a threshold voltage of memory cell MC is driven to a relatively high value (4V). Data "0" is stored in this state.

In an erasing operation, as shown in middle boxes of FIG. 5, 10V, 0V, 0V, and 0V are respectively applied to source 11, drain 12, gate electrode 16, and substrate 10. As a result, the electrons trapped in $Si_3N_4$ film 14 near source 11 are drawn to source 11 by a tunneling, and the threshold voltage of memory cell MC is driven to a relatively low value (1V). Data "1" is stored in this state.

In a reading operation, as shown in lower boxes of FIG. 5, 0V, 2V, 3V, and 0V are respectively applied to source 11, drain 12, gate electrode 16, and substrate 10. When the threshold voltage of memory cell MC is high (when data "0" is stored), no current flows between source 11 and drain 12. When the threshold voltage of memory cell MC is low (when data "1" is stored), a current flows between source 11 and drain 12. Accordingly, with a detection as to whether or not a current flows between source 11 and drain 12, the stored data in memory cell MC can be read.

Figure 6:
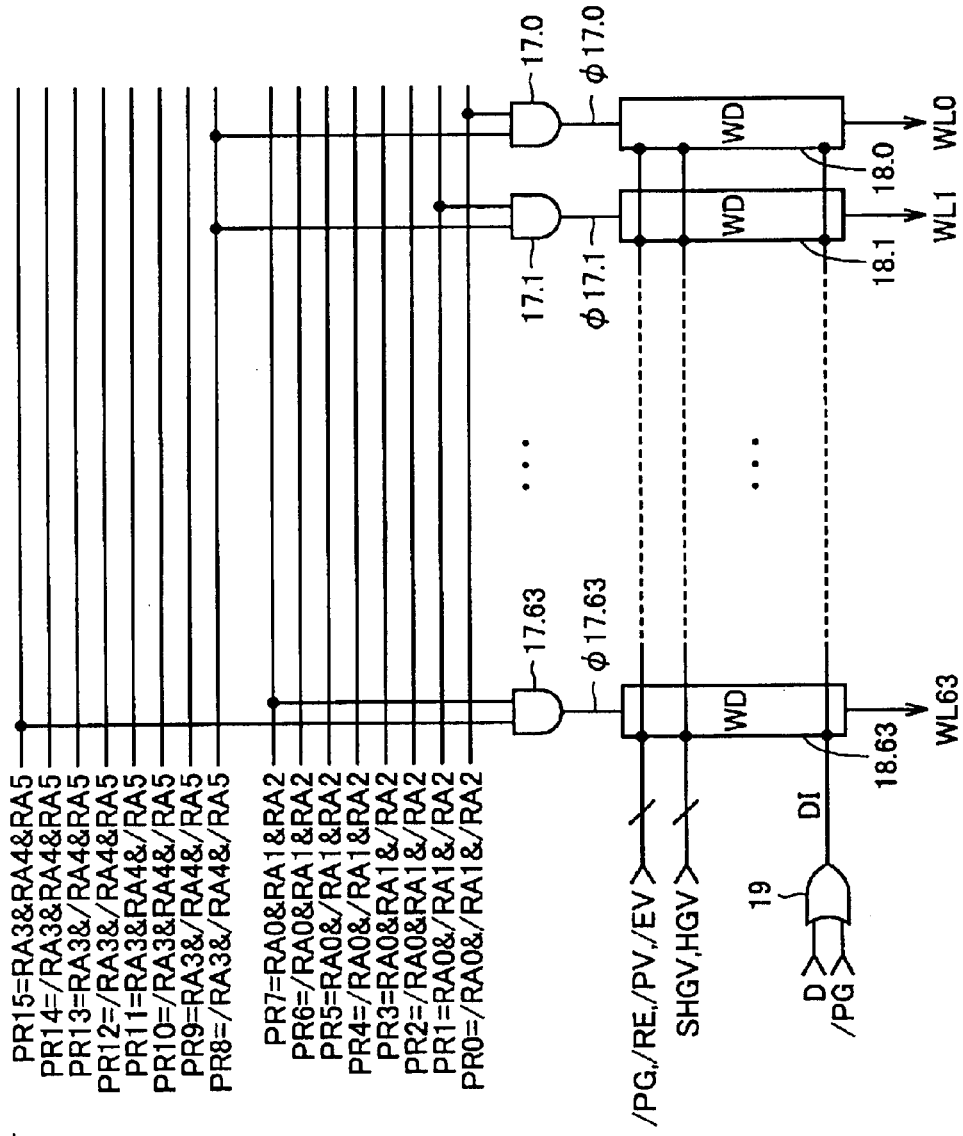
FIG. 6 is a circuit block diagram illustrating a configuration of a row decoder shown in FIG. 1.

Row decoder 3 is controlled by peripheral circuit 6, and causes each word line WL to attain a write potential SHGV (=10V), a read potential HGV (=3V), or a ground potential GND (=0V). That is, as shown in FIG. 6, row decoder 3 includes AND gates 17.0 to 17.63, word drivers (WD) 18.0 to 18.63, and an OR gate 19.

Row decoder 3 receives predecoded signals PR0 to PR15 from peripheral circuit 6. Predecoded signals PR0 to PR7 are made from row address signals RA0 to RA2 and their inverted signals /RA0 to /RA2. For example, predecoded signal PR0 is an AND signal of signals /RA0, /RA1 and /RA2. Predecoded signal PR1 is an AND signal of signals RA0, /RA1 and /RA2. Predecoded signal PR7 is an AND signal of signals RA0, RA1 and RA2.

Predecoded signals PR8 to PR15 are made from row address signals RA3 to RA5 and their inverted signals /RA3 to /RA5. For example, predecoded signal PR8 is an AND signal of signals /RA3, /RA4 and /RA5. Predecoded signal PR9 is an AND signal of signals RA3, /RA4 and /RA5. Predecoded signal PR15 is an AND signal of signals RA3, RA4 and RA5.

One of predecoded signals PR0 to PR7 and one of predecoded signals PR8 to PR15 are allocated to each word line WL in advance. For instance, predecoded signals PR0 and PR 8 are allocated to word line WL0. Predecoded signals PR1 and PR8 are allocated to word line WL1. Predecoded signals PR7 and PR15 are allocated to word line WL63.

AND gates 17.0 to 17.63 are respectively provided corresponding to word lines WL0 to WL63. Each of output signals of AND gates 17.0 to 17.63 rises to an "H" level, in response to both of two predecoded signals (e.g. PR0, PR8) allocated to the corresponding word line WL rising to the "H" level. Thus, an output signal from one of AND gates 17.0 to 17.63 is raised to an active level of "H" by a logic level combination of row address signals RA0 to RA5.

In response to output signals φ17.0 to φ17.63 from AND gates 17.0 to 17.63 respectively rising to the active level of "H", corresponding one of word drivers 18.0 to 18.63 is selected. Word drivers 18.0 to 18.63 respectively cause word lines WL0 to WL63 to attain ground potential GND, write potential SHGV, or read potential HGV. Each of word drivers 18.0 to 18.63 receives internal control signals /PG, /RE, /PV, /EV from peripheral circuit 6, write potential SHGV and read potential HGV from internal potential generation circuit 5, and internal write data signal DI. OR gate 19 receives external write data signal D and internal control signal /PG, and outputs internal write data signal DI. Internal write data signal DI is raised to the "H" level in the erasing operation.

Figure 7:
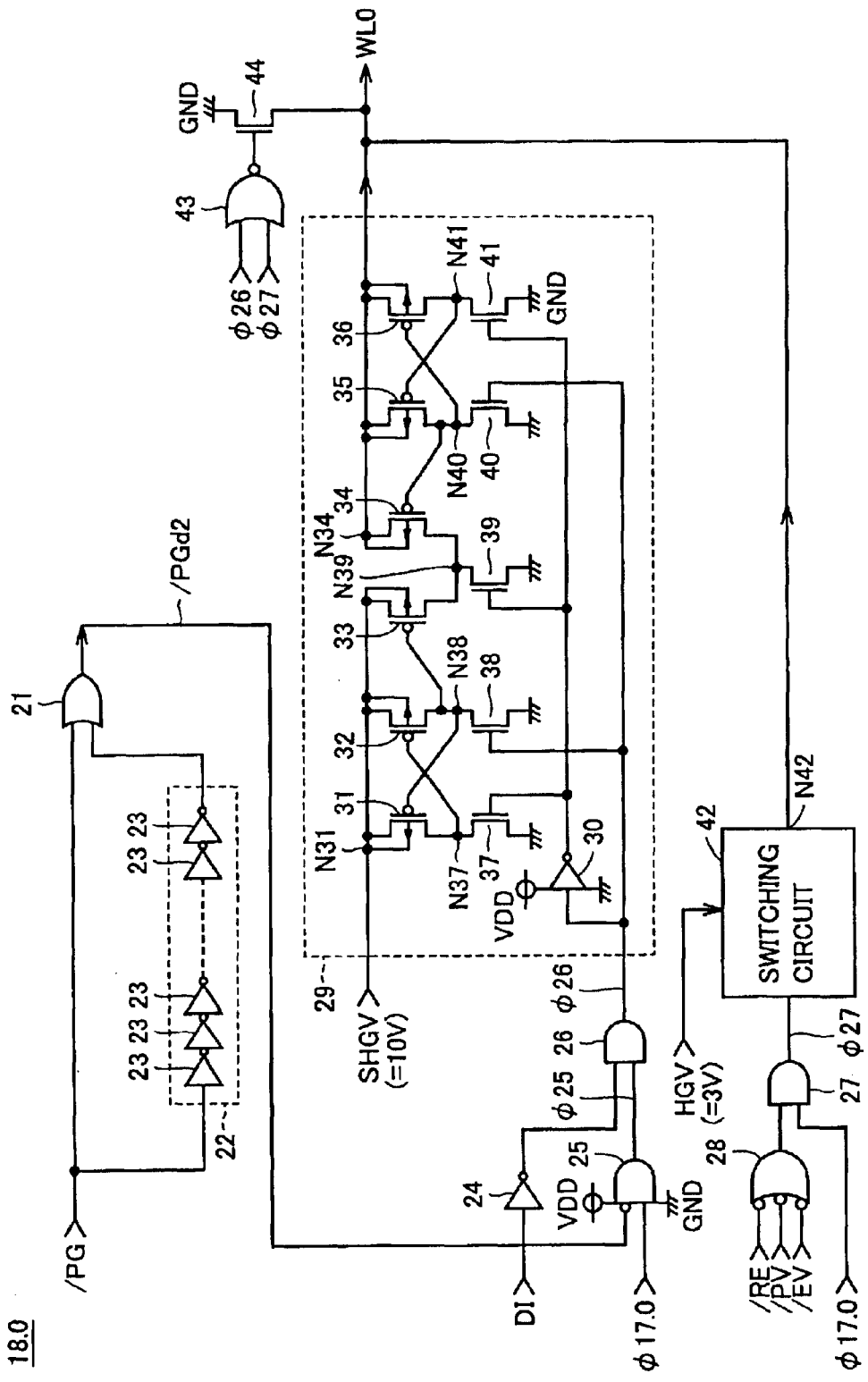
FIG. 7 is a circuit block diagram illustrating a configuration of a word driver shown in FIG. 6.

As shown in FIG. 7, word driver 18.0 includes an OR gate 21, a delay circuit 22, an inverter 24, a gate circuit 25, AND gates 26, 27, an NAND gate 28, switching circuits 29, 42, an NOR gate 43, and an N channel MOS (Metal Oxide Semiconductor) transistor 44. Internal control signal /PG is directly input to one input node of OR gate 21 and is also input to the other input node of OR gate 21 via delay circuit 22. Delay circuit 22 includes an even number of inverters 23 connected in series.

When signal /PG is at an inactive level of "H," an output signal /PGd2 of OR gate 21 is at the "H" level. When signal /PG is caused to fall to an active level of "L," after a delay time Td22 of delay circuit 22, an output signal of delay circuit 22 falls to the "L" level, and output signal /PGd2 of OR gate 21 falls to the "L" level. When signal /PG is raised to the inactive level of "H," signal /PGd2 also rises to the "H" level. That is, OR gate 21 and delay circuit 22 form a delay circuit delaying a falling edge of signal /PG for a prescribed period of time Td22.

Inverter 24 applies an inverted signal of internal write data signal DI to one input node of AND gate 26. Gate circuit 25 raises an output signal $\phi 25$ to the "H" level, only when signal /PGd2 is at the "L" level and output signal $\phi 17.0$ of AND gate 17.0 is at the "H" level. Signal $\phi 25$ is applied to the other input node of AND gate 26. An output signal $\phi 26$ of AND gate 26 is applied to switching circuit 29.

Switching circuit 29 includes an inverter 30, P channel MOS transistors 31 to 36, and N channel MOS transistors 37 to 41. An input node N31 receives write potential SHGV. An output node N34 is connected to word line WL0. P channel MOS transistors 31 and 32 are respectively connected between input node N31 and nodes N37, N38, and their gates are respectively connected to nodes N38 and N37. P channel MOS transistors 35 and 36 are respectively connected between output node N34 and nodes N40, N41, and their gates are respectively connected to nodes N41 and N40. P channel MOS transistors 33 and 34 are respectively connected between input node N31 and a node N39 and between output node N34 and node N39. The gates of transistors 33 and 34 are respectively connected to nodes N38 and N40. N channel MOS transistors 37 to 41 are respectively connected between nodes N37 to N41 and a line of ground potential GND. Output signal $\phi 26$ of AND gate 26 is input to the gates of N channel MOS transistors 37, 39, and 41 via inverter 30, and also directly input to the gates of N channel MOS transistors 38 and 40.

When signal $\phi 26$ is at the "L" level, N channel MOS transistors 37, 39, and 41, and P channel MOS transistors 32 and 35 are rendered conductive, while N channel MOS transistors 38 and 40 and P channel MOS transistors 31, 33, 34, and 36 are rendered non-conductive, and output node N34 is insulated from write potential SHGV.

When signal $\phi 26$ is at the "H" level, N channel MOS transistors 38 and 40, and P channel MOS transistors 31, 33, 34, and 36 are rendered conductive, while N channel MOS transistors 37, 39, and 41, and P channel MOS transistors 32 and 35 are rendered non-conductive, and write potential SHGV is applied to word line WL0 via P channel MOS transistors 33 and 34.

NAND gate 28 receives internal control signals /RE, /PV, and /EV. AND gate 27 receives an output signal of NAND gate 28 and output signal $\phi 17.0$ of AND gate 17.0. Switching circuit 42 has the same configuration as switching circuit 29.

Switching circuit 42 receives an output signal $\phi 27$ of AND gate 27 and read potential HGV, and its output node N42 is connected to word line WL0.

When signal $\phi 27$ is at the "L" level, output node N42 is insulated from read potential HGV. When signal $\phi 27$ is at the "H" level, read potential HGV is applied to word line WL0 via output node N42.

NOR gate 43 receives output signals $\phi 26$ and $\phi 27$ of AND gates 26 and 27. N channel MOS transistor 44 is connected between word line WL0 and a line of ground potential GND, and its gate receives an output signal of NOR gate 43.

When one of signals $\phi 26$ and $\phi 27$ is at the "H" level, the output signal of NOR gate 43 falls to the "L" level and N channel MOS transistor 44 is rendered non-conductive.

When both of signals $\phi 26$ and $\phi 27$ are at the "L" level, the output signal of NOR gate 43 rises to the "H" level, N channel MOS transistor 44 is rendered conductive, and word line WL0 is caused to attain ground potential GND. Other word drives 18.1 to 18.63 have the same configurations as word driver 18.0.

Figure 8:
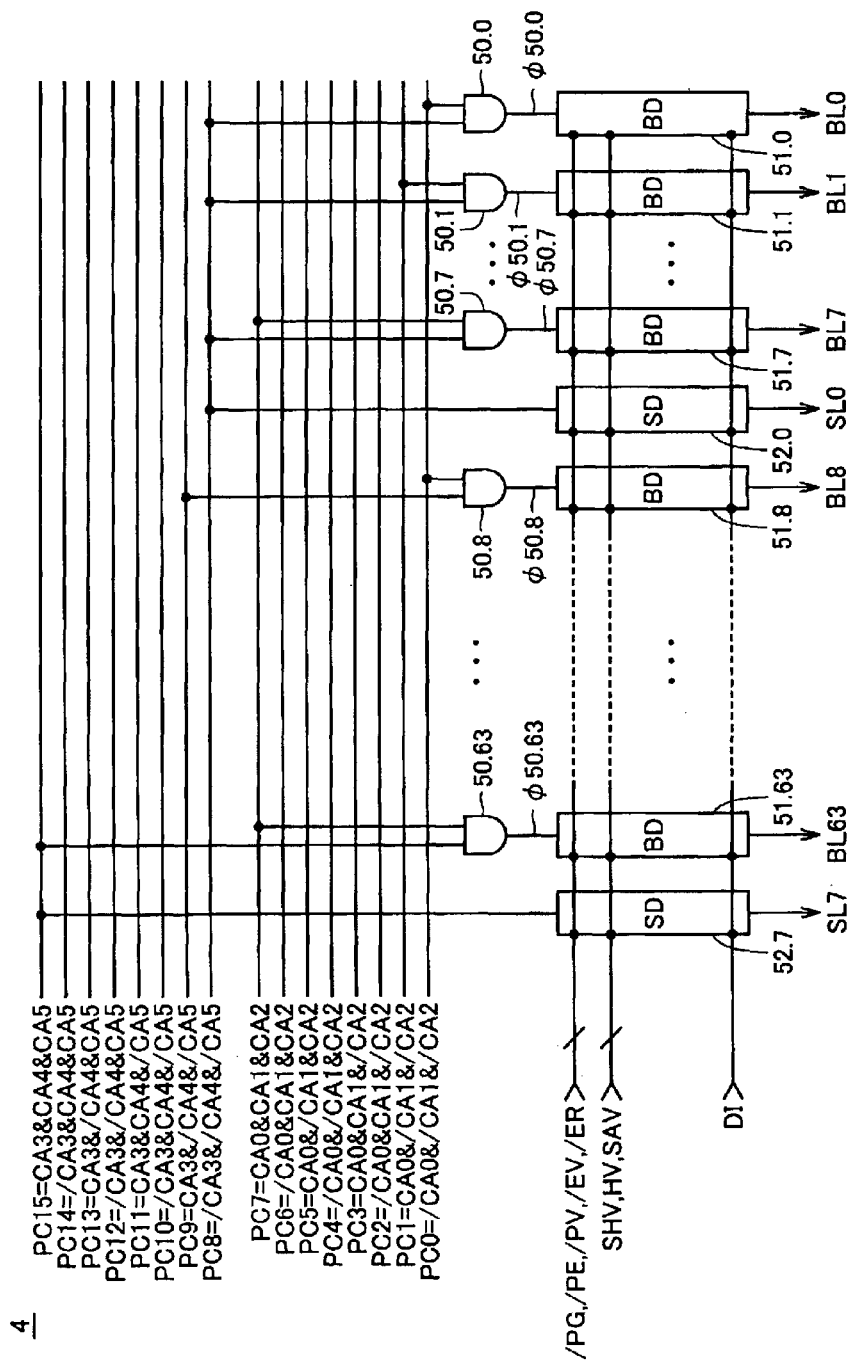
FIG. 8 is a circuit block diagram illustrating a configuration of a column decoder shown in FIG. 1.

Column decoder 4 is controlled by peripheral circuit 6 and causes each bit line BL to attain a first potential HV (=5V), a second potential SAV (approximately equal to 2V), or ground potential GND. Column decoder 4 also causes each source line SL to attain an erase potential SHV (=10V), first potential HV (=5V), or ground potential GND. That is, as shown in FIG. 8, column decoder 4 includes AND gates 50.0 to 50.63, bit drivers (BD) 51.0 to 51.63, and source drivers (SD) 52.0 to 52.7.

Column decoder 4 receives predecoded signals PC0 to PC15 from peripheral circuit 6. Predecoded signals PC0 to PC7 are made from column address signals CA0 to CA2 and their inverted signals /CA0 to /CA2. For example, predecoded signal PC0 is an AND signal of signals /CA0, /CA1 and /CA2. Predecoded signal PC1 is an AND signal of signals CA0, /CA1 and /CA2. Predecoded signal PC7 is an AND signal of signals CA0, CA1 and CA2.

Predecoded signals PC8 to PC15 are made from column address signals CA3 to CA5 and their inverted signals /CA3 to /CA5. For example, predecoded signal PC8 is an AND signal of signals /CA3, /CA4 and /CA5. Predecoded signal PC9 is an AND signal of signals CA3, /CA4 and /CA5. Predecoded signal PC15 is an AND signal of signals CA3, CA4 and CA5.

One of predecoded signals PC0 to PC7 and one of predecoded signals PC8 to PC15 are allocated to each bit line BL in advance. For instance, predecoded signals PC0 and PC 8 are allocated to bit line BL0. Predecoded signals PC1 and PC8 are allocated to bit line BL1. Predecoded signals PC7 and PC15 are allocated to bit line BL63.

AND gates 50.0 to 50.63 are respectively provided corresponding to bit lines BL0 to BL63. Each of output signals of AND gates 50.0 to 50.63 rises to the "H" level, in response to both of two predecoded signals (e.g. PC0, PC8) allocated to the corresponding bit line BL rising to the "H" level. Thus, only an output signal from one of AND gates 50.0 to 50.63 is raised to the active level of "H" by a logic level combination of column address signals CA0 to CA5.

In response to output signals $\phi 50.0$ to $\phi 50.63$ from AND gates 50.0 to 50.63 respectively rising to the active level of "H," corresponding one of bit drivers 51.0 to 51.63 is selected. Bit drivers 51.0 to 51.63 respectively cause bit lines BL0~BL63 to attain ground potential GND, first potential HV, or second potential SAV. Each of bit drivers 51.0 to 51.63 receives internal control signals /PG, /RE, /PV, /EV, and a second potential SAV from peripheral circuit 6, first potential HV from internal potential generation circuit 5, and internal write data signal DI.

Predecoded signals PC8 to PC15 are respectively allocated to source potentials SL0 to SL7 in advance. In response to predecoded signals PC8 to PC15 respectively rising to the active level of "H," corresponding one of source drivers 52.0 to 52.7 is selected. Source drivers 52.0 to 52.7 respectively cause source lines SL0 to SL7 to attain erase potential SHV, first potential HV, or ground potential GND. Each of source drivers 52.0 to 52.7 receives internal control signals /PG, /ER from peripheral circuit 6, erase potential SHV and first potential HV from internal potential generation circuit 5, and internal write data signal DI.

Figure 9:
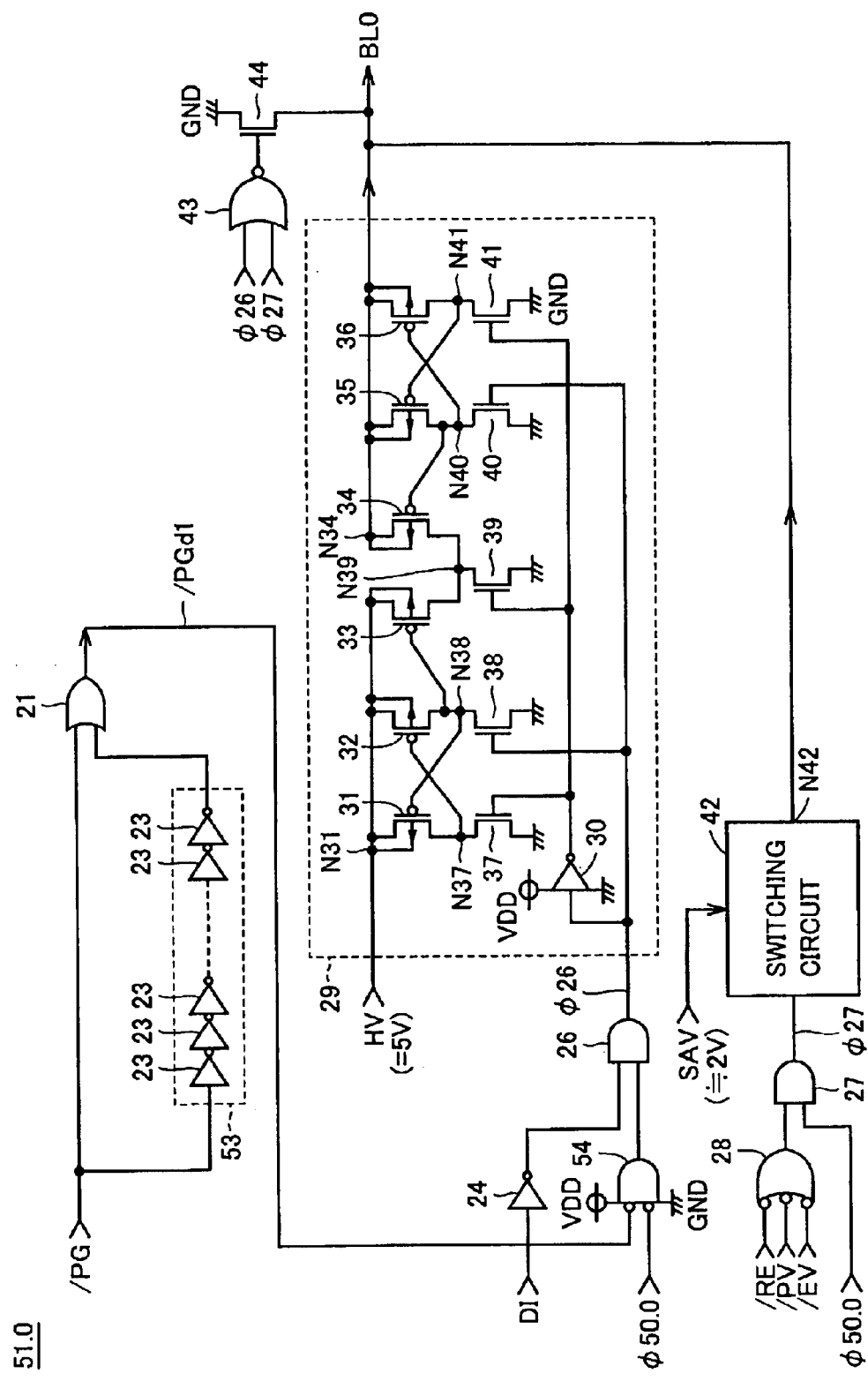
FIG. 9 is a circuit block diagram illustrating a configuration of a bit driver shown in FIG. 8.

FIG. 9 is a circuit block diagram showing a configuration of bit driver 51.0. Referring to FIG. 9, this bit driver 51.0 is different from word driver 18.0 in FIG. 7 in that delay circuit 22 is replaced by a delay circuit 53, gate circuit 25 is replaced by an NOR gate 54, first potential HV and second potential SAV are applied instead of write potential SHGV and read potential HGV, and signal φ50.0 is applied instead of signal φ17.0.

Delay circuit 53 includes an even number of inverters 23 connected in series. The number of stages of inverters 23 in delay circuit 53 is, for example, a half that of inverters 23 in delay circuit 22. A delay time Td53 of delay circuit 53 is a half of delay time Td22 of delay circuit 22. An output signal /PGd1 of an OR gate 21 is signal /PG with its falling edge delayed for delay time Td53 of delay circuit 53. Signal /PGd1 is input to one of input nodes of NOR gate 54. Output signal φ50.0 of AND gate 50.0 is input to the other input node of NOR gate 54. An output signal of NOR gate 54 is input to the other input node of an AND gate 26.

When an output signal φ26 of AND gate 26 is at the "H" level, an output node N34 of a switching circuit 29 is caused to attain first potential HV. When signal φ26 is at the "L" level, output node N34 of switching circuit 29 is insulated from first potential HV. When an output signal φ27 of an AND gate 27 is at the "H" level, an output node N42 of a switching circuit 42 is caused to attain second potential SAV. When signal φ27 is at the "L" level, output node N42 of switching circuit 42 is insulated from second potential SAV.

When one of output signals φ26 and φ27 of AND gates 26 and 27 is at the "H" level, an output signal of an NOR gate 43 falls to the "L" level and an N channel MOS transistor 44 is rendered non-conductive. When both of signals φ26 and φ27 are at the "L" level, the output signal of NOR gate 43 rises to the "H" level, N channel MOS transistor 44 is rendered conductive, and bit line BL0 is caused to attain ground potential GND. Other bit drivers 51.1 to 51.63 have the same configurations as bit driver 51.0.

Figure 10:
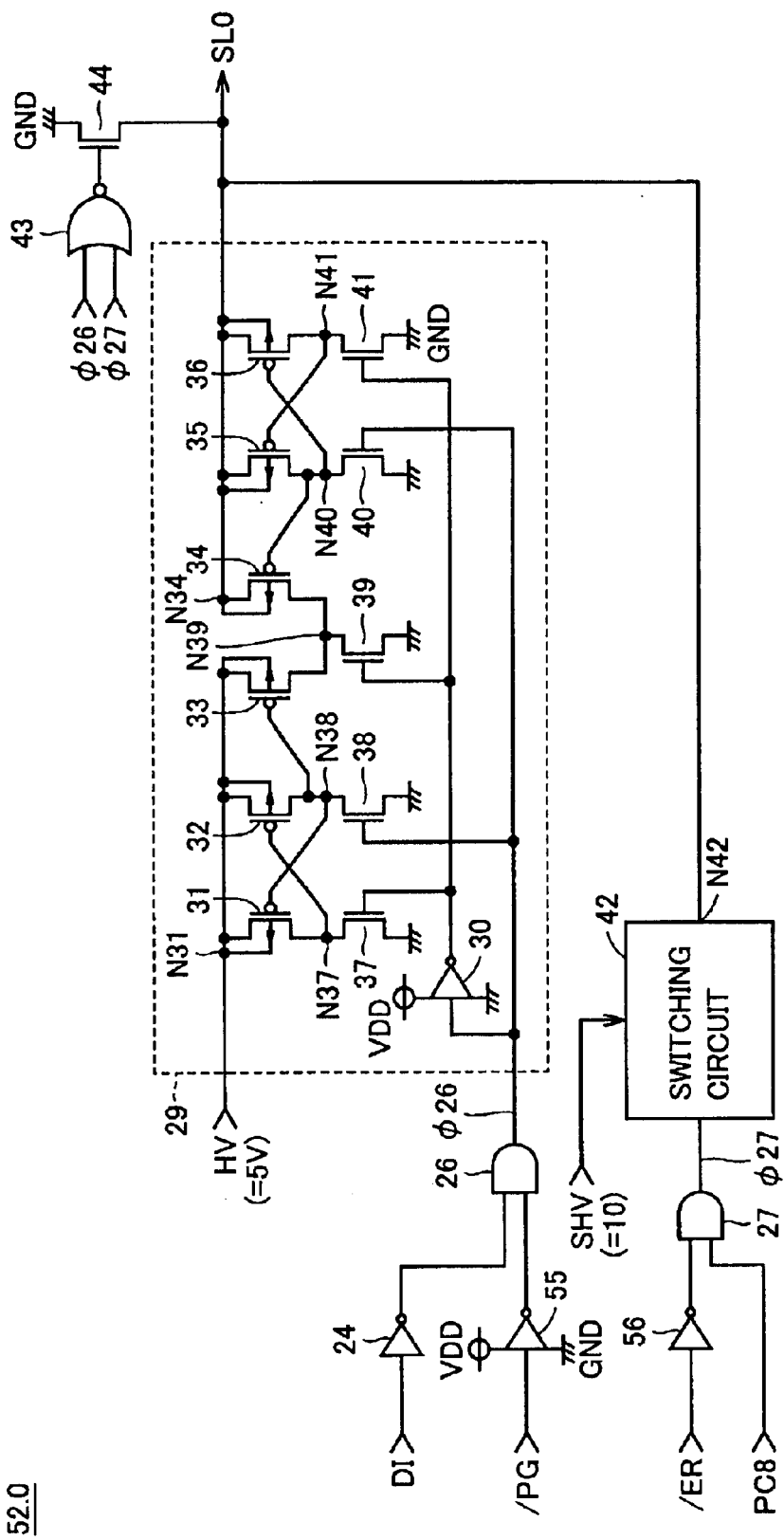
FIG. 10 is a circuit block diagram illustrating a configuration of a source driver shown in FIG. 8.

FIG. 10 is a block diagram showing a configuration of source driver 52.0. Referring to FIG. 10, this source driver 52.0 is different from bit driver 51.0 in FIG. 9 in the following points. That is, OR gate 21, delay circuit 53, and NOR gate 54 are replaced by an inverter 55 and signal /PG is input to the other input node of an AND gate 26 via inverter 55. In addition, NAND gate 28 is replaced by an inverter 56 and signal /ER is input to one of input nodes of an AND gate 27 via inverter 56. Furthermore, instead of signal φ50.0, predecoded signal PC8 is input to the other input node of AND gate 27, and instead of second potential SAV, erase potential SHV is applied to a switching circuit 42.

When an output signal φ26 of AND gate 26 is at the "H" level, an output node N34 of a switching circuit 29 is caused to attain first potential HV. When signal φ26 is at the "L" level, output node N34 of switching circuit 29 is insulated from first potential HV.

When an output signal φ27 of AND gate 27 is at the "H" level, an output node N42 of a switching circuit 42 is caused to attain erase potential SHV. When signal φ27 is at the "L" level, output node N42 of switching circuit 42 is insulated from erase potential SHV.

When one of output signals φ26 and φ27 of AND gates 26 and 27 is at the "H" level, an output signal of an NOR gate 43 falls to the "L" level and an N channel MOS transistor 44 is rendered non-conductive. When both of signals φ26 and φ27 are at the "L" level, the output signal of NOR gate 43 rises to the "H" level, N channel MOS transistor 44 is rendered conductive, and bit line BL0 is caused to attain ground potential GND. Other source drivers 52.1 to 52.7 have the same configurations as source driver 52.0.

Referring back to FIG. 1, internal potential generator 5 produces write potential SHGV (=10V) and read potential HGV (=3V) in accordance with external power potential VDD (=3.3V) and ground potential GND (=0V) and applies them to row decoder 3. Furthermore, internal potential generator 5 produces erase potential SHV (=10V) and first potential HV (=5V) in accordance with external power potential VDD and ground potential GND, and applies them to column decoder 4.

Peripheral circuit 6 generates various types of internal control signals /PG, /PV, /ER, /EV, /RE, . . . in accordance with a plurality of external command signals (CMD), and controls the entire flash memory 1. In addition, peripheral circuit 6 generates row address signals RA0 to RA5 in accordance with the plurality of external command signals (CM1) and an external address signal ADD. In accordance with row address signals RA0 to RA5, peripheral circuit 6 further generates predecoded signals PR0 to PR15, and applies predecoded signals PR0 to PR15 to row decoder 3.

Peripheral circuit 6 generates column address signals CA0 to CA5 in accordance with the plurality of external command signals (CM1) and external address signal ADD. In accordance with row address signals CA0 to CA5, peripheral circuit 6 further generates predecoded signals PC0 to PC 15, and applies predecoded signals PC0 to PC15 to column decoder 4. In the writing operation, peripheral circuit 6 applies an external data signal D to row decoder 3 and column decoder 4. In addition, in the reading operation and a verify operation, peripheral circuit 6 reads stored data of memory cell MC through bit line BL selected by column decoder 4. Peripheral circuit 6 outputs a read data signal Q to the outside in the reading operation.

Figure 11:
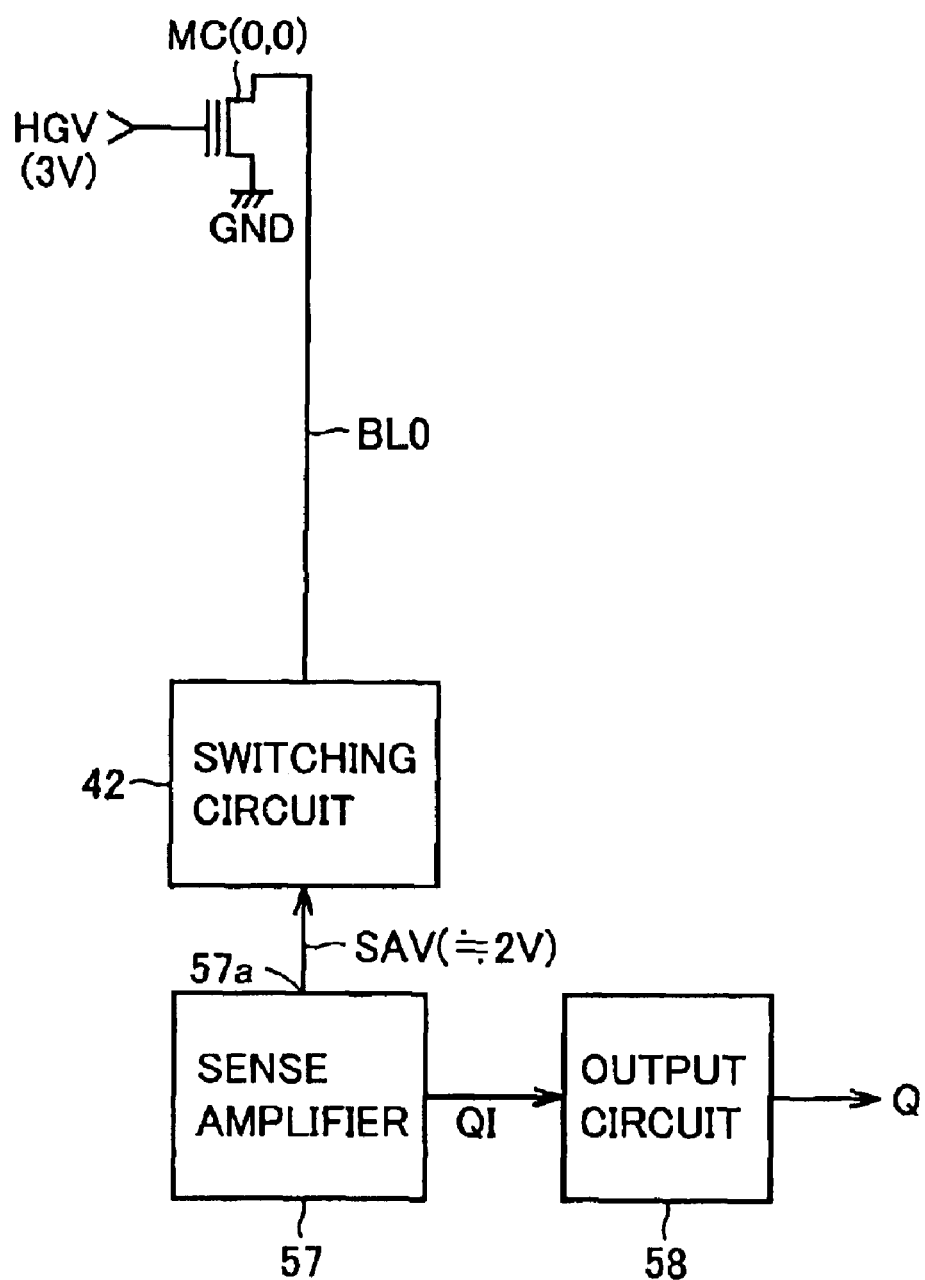
FIG. 11 is a block diagram describing a reading operation of a peripheral circuit shown in FIG. 1.

FIG. 11 is a circuit block diagram showing a sense amplifier 57 and an output circuit 58 included in peripheral circuit 6. In FIG. 11, an output node 57a of sense amplifier 57 is connected to a selected bit line (e.g. BL0) via a switching circuit 42 of the bit driver in the reading operation. Sense amplifier 57 detects whether or not a current flows in bit line BL0 and outputs a signal QI at a level corresponding to the detection result. In response to output signal QI of sense amplifier 57, output circuit 58 outputs read data signal Q to the outside.

When memory cell MC (0,0) is programmed, the threshold voltage of memory cell MC (0,0) is 4V. Accordingly, memory cell MC (0,0) is rendered non-conductive and no current flows through bit line BL0. Sense amplifier 57 detects that no current flows through bit line BL0, and causes signal QI to fall to the "L" level. In accordance with signal QI from sense amplifier 57, output circuit 58 outputs, to the outside, read data signal Q at the "L" level indicating that the stored data in memory cell MC (0,0) is "0."

When memory cell MC (0,0) is not programmed, the threshold voltage of memory cell MC (0,0) is 1V. Accordingly, memory cell MC (0,0) is rendered conductive and a current flows through bit line BL0. Sense amplifier 57 detects the current flow through bit line BL0, and causes signal QI to rise to the "H" level. In accordance with signal QI from sense amplifier 57, output circuit 58 outputs, to the outside, read data signal Q at the "H" level indicating that the stored data in memory cell MC (0,0) is "1."

Figure 12:
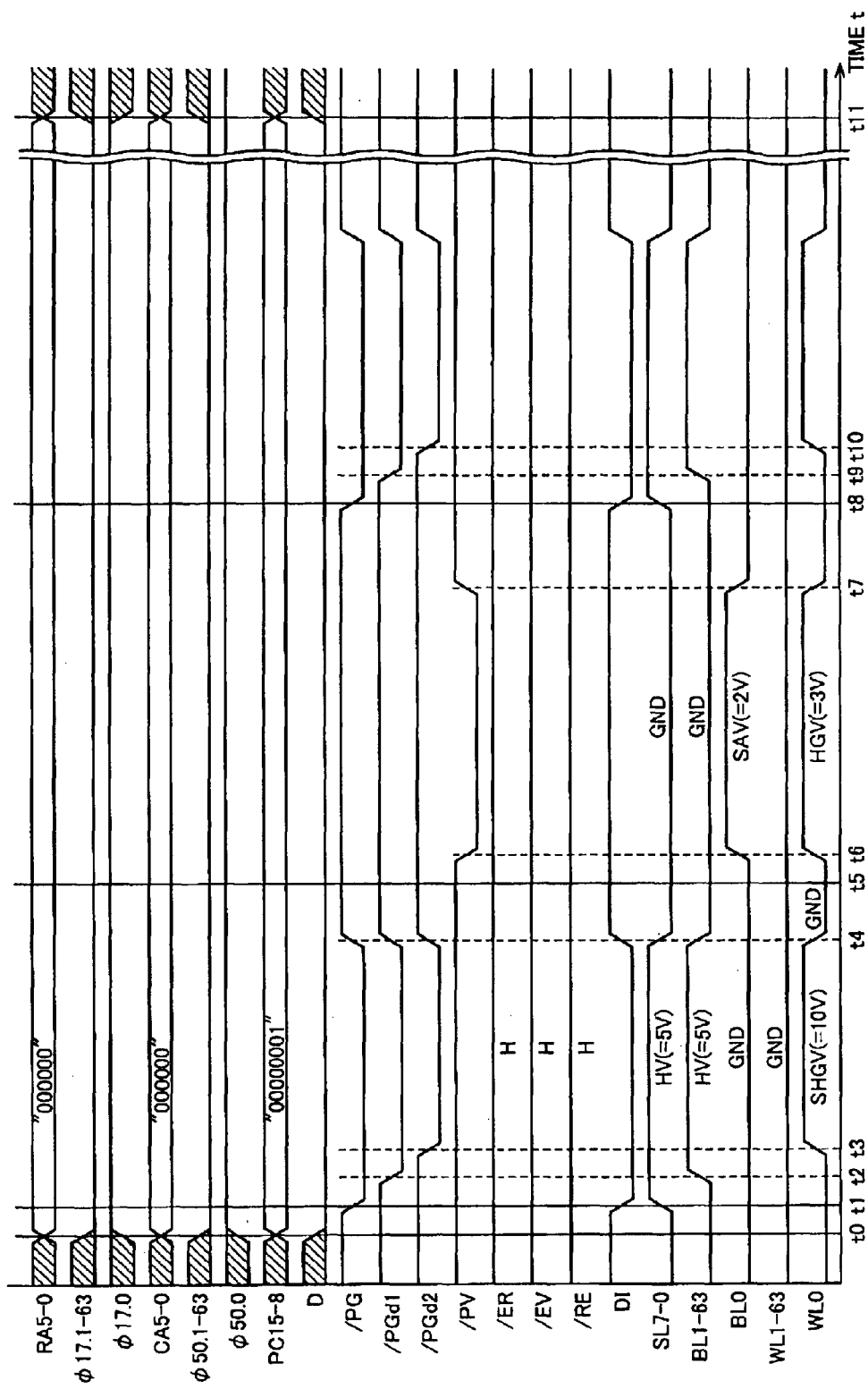
FIG. 12 is a time chart showing a writing operation of the flash memory shown in FIG. 1.

An operation of this flash memory 1 is now described. FIG. 12 is a time chart showing the writing operation of this flash memory 1. A description is given about writing data "0" to memory cell MC (0,0) designated by row address signals RA5 to RA0=000000 and column address signals CA5 to CA0=000000.

At time t0, row address signals RA5 to RA0=000000 are input, and output signal φ17.0 of AND gate 17.0 in FIG. 6 is raised to the "H" level while output signals φ17.1 to φ17.63 of AND gates 17.1 to 17.63 are caused to fall to the "L" level. Furthermore, column address signals CA5 to CA0=000000 are input, and output signal φ50.0 of AND gate 50.0 in FIG. 8 is raised to the "H" level while output signals φ50.1 to φ50.63 of AND gates 50.1 to 50.63 are caused to fall to the "L" level. Because of column address signals CA5 to CA0=000000, predecoded signals PC15 to PC8 become "00000001." External data signal D is caused to fall to the "L" level. At this time, all the internal control signals /PG, /PV, /ER, /EV, and /RE are at the "H" level, and all word lines WLs, bit lines BLs, and source lines SLs are at ground potential GND.

Next, at time t1, internal control signal /PG is caused to fall to the active level of "L," internal data signal DI in FIG. 9, which is the output signal of OR gate 19, falls to the "L" level, output signal φ26 of AND gate 26 in FIG. 10 rises to the "H" level, and all source lines SL0 to SL7 are caused to attain first potentials HVs (=5V). As a result, first potential HV (=5V) is applied to the sources 11 of all memory cells MCs in memory array 2.

Thereafter, between time t1 and time t2 after delay time Td53 of delay circuit 53 in FIG. 9, output signal /PGd1 of OR gate 21 is caused to fall to the "L" level, output signals φ26 of AND gates 26 in bit drivers 51.1 to 51.63 rise to the "H" level, and bit lines BL1 to BL63 are caused to attain first potentials HVs (=5V). In bit driver 51.0, both output signals φ26 and φ27 of AND gates 26 and 27 are caused to fall to the "L" level, N channel MOS transistor 44 is rendered conductive, and bit line BL0 is caused to attain ground potential GND. As a result, a potential difference of 5V is produced between the source and the drain of memory cell MC connected to bit line BL0, whereas no potential difference is produced between the source and the drain of memory cell MC connected to bit line BL other than bit line BL0.

Between time t1 and time t3 after delay time Td22 of delay circuit 22 in FIG. 7, output signal /PGd2 of OR gate 21 is caused to fall to the "L" level, output signal φ26 of AND gate 26 in word driver 18.0 rises to the "H" level, and word line WL0 is caused to attain write potential SHGV (=10V). In other word drivers 18.1 to 18.63, both output signals φ26 and φ27 of AND gates 26 and 27 are caused to fall to the "L" level, N channel MOS transistor 44 is rendered conductive, and word lines WL1 to WL63 are together caused to attain ground potential GND.

At this time, the gate, the source, and the drain of memory cell MC (0,0) are respectively at 10V, 5V, and 0V. As described in FIG. 5, the threshold voltage value of memory cell MC (0,0) becomes relatively high (=4V), and data "0" is stored. In a memory cell MC arranged in the same row but in a different column with respect to memory cell MC (0,0), the gate, the source and the drain are respectively at 10V, 5V, and 5V. Since there is no potential difference between the source and the drain, no programming occurs. In a memory cell MC arranged in the same column but in a different row with respect to memory cell MC (0,0), the gate, the source, and the drain are respectively at 0V, 5V, and 0V. As a result, a transistor forming memory cell MC is rendered non-conductive, and no programming occurs. In a memory cell MC arranged in different row and column from memory cell MC (0,0), the gate, the source, and the drain are respectively at 0V, 5V, and 5V. As a result, a transistor forming memory cell MC is rendered non-conductive and there is no potential difference between the source and the drain. Accordingly, no programming occurs. That is, only memory cell MC (0,0) is selectively programmed.

At time t4, when internal control signal /PG is raised to the "H" level, signals /PGd1, /PGd2, and DI together rise to the "H" level, and all word lines WLs, bit lines BLs, and source lines SLs attain ground potential GND. The time period between time t1 and t5 is referred to as an electron injection cycle.

At time t6, when internal control signal /PV is caused to fall to the active level of "L," signal φ27 in FIG. 7 rises to the "H" level and read potential HGV (=3V) is applied to word line WL0, while signal φ27 in FIG. 9 rises to the "H" level and second potential SAV (approximately equal to 2V) is applied to bit line BL0. At this time, if memory cell MC (0,0) is sufficiently programmed and the threshold voltage value of memory cell MC (0,0) is high (4V), no current flows between the source and the drain of memory cell MC (0,0). If memory cell MC (0,0) is not sufficiently programmed and the threshold voltage of memory cell MC (0,0) is lower than 4V, a current flows between the source and the drain of memory cell MC (0,0).

Sense amplifier 57 in peripheral circuit 6 detects whether or not a current flows between the source and the drain of memory cell MC (0,0). Based on the detection result from sense amplifier 57, peripheral circuit 6 determines whether or not memory cell MC (0,0) is sufficiently programmed.

At time t7, when internal control signal /PV is raised to the "H" level, bit line BL0 and word line WL0 are caused to attain ground potential GND. A time period between time t5 and t8 is referred to as a verify cycle. The aforementioned electron injection cycle (time t1 to t5) and the verify cycle (time t5 to t8) are together referred to as a program cycle.

When a determination is made at the verify cycle that memory cell MC (0,0) is sufficiently programmed, the writing operating terminates at time t8. When a determination is made at the verify cycle that memory cell MC (0,0) is not sufficiently programmed, the program cycle is repeated (time t8 to t11) until the sufficient programming of memory cell MC (0,0) is achieved. The writing operation starting at time t0 terminates at time t11.

Figure 13:
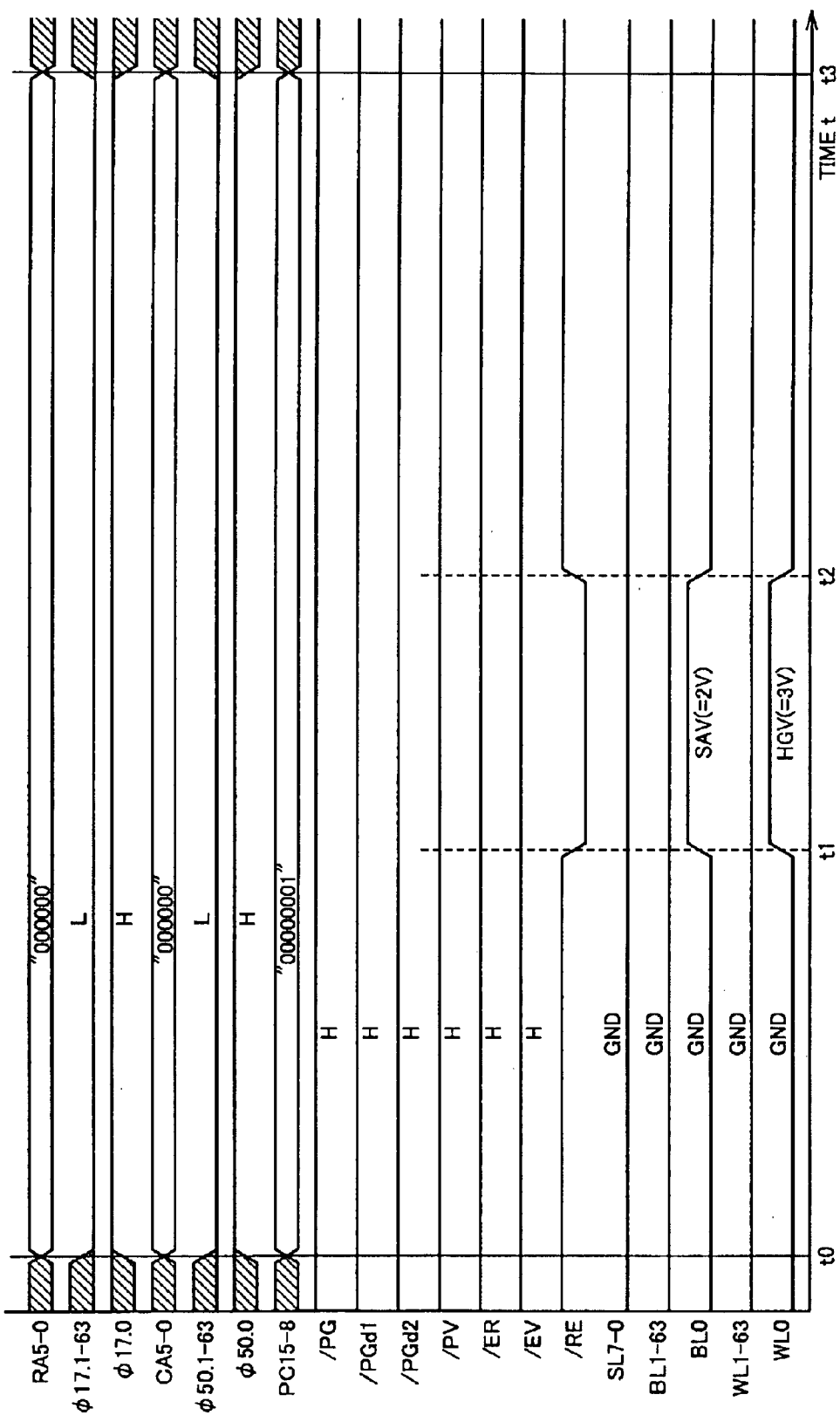
FIG. 13 is a time chart showing a reading operation of the flash memory shown in FIG. 1.

FIG. 13 is a time chart showing a reading operation of this flash memory 1. Here, a description is given about reading stored data in memory cell MC (0,0) designated by row address signals RA5 to RA0=000000 and column address signals CA5 to CA0=000000.

At time t0, row address signals RA5 to RA0=000000 are input, and output signal φ17.0 of AND gate 17.0 in FIG. 6 is raised to the "H" level, while output signals φ17.1 to φ17.63 of AND gates 17.1 to 17.63 are caused to fall to the "L" level. Furthermore, column address signals CA5 to CA0=000000 are input, and output signal φ50.0 of AND gate 50.0 in FIG. 8 is raised to the "H" level, while output signals φ50.1 to φ50.63 of AND gates 50.1 to 50.63 are caused to fall to the "L" level. Because of column address signals CA5 to CA0=000000, predecoded signals PC15 to PC8 become "00000001." At this time, all internal control signals /PG, /PV, /ER, /EV, and /RE are at the "H" level, and all word lines WLs, bit lines BLs, and source lines SLs are caused to attain ground potential GND.

Next, internal control signal /RE is caused to fall to the active level of "L," signal φ27 in FIG. 7 rises to the "H" level and read potential HGV (=3V) is applied to word line WL0 while signal φ27 in FIG. 9 rises to the "H" level and second potential SAV (approximately equal to 2V) is applied to bit line BL0. This second potential SAV is a precharge potential from sense amplifier 57. At this time, the gate, the source, and the drain of memory cell MC (0,0) are respectively caused to be at 3V, 0V, and 2V.

When memory cell MC (0,0) is programmed, the threshold voltage of memory cell MC (0,0) is 4V. Accordingly, memory cell MC (0,0) is rendered non-conductive, and no current flows through bit line BL0. Sense amplifier 57 detects no current flowing through bit line BL0. Output circuit 58 outputs, to the outside, read data signal Q at the "L" level indicating that the stored data in memory cell MC (0,0) is "0."

When memory cell MC (0,0) is not programmed, the threshold voltage of memory cell MC (0,0) is 1V. Accordingly, memory cell MC (0,0) is rendered conductive and a current flows through bit line BL0. Sense amplifier 57 detects that a current flows through bit line BL0. Output circuit 58 outputs, to the outside, read data signal Q at the "H" level indicating that the stored data in memory cell MC (0,0) is "1."

When internal control signal /RE is raised to the "H" level at time t2, bit line BL0 and word line WL0 are caused to attain ground potential GND. The reading operation starting at time t0 terminates at time t3.

In an erasing operation, for example, when data of all memory cells MCs in memory block MB0 are to be erased, predecoded signal PC8 in FIG. 10 is raised to the "H" level while internal control signal /ER is caused to fall to the "L" level so that signal φ27 rises to the "H" level. As a result, erase potential SHV (=10V) is applied to source line SL0, and the data of all memory cells MCs in memory block MB0 are erased.

In the present embodiment, MONOS type memory cell MC is utilized. As a result, the manufacturing process can be simpler compared to a flash memory using a conventional memory cell with a floating gate. In addition, the data retention capability can be higher in comparison with the case in which an MNOS type memory cell is utilized.

Additionally, since MONOS type memory cell MC is utilized as a one bit/cell-memory cell, it is unnecessary to increase distance between the source side portion and the drain side portion of $Si_3N_4$ film 14. Accordingly, the layout area can be reduced.

Since MONOS type memory cell MC is utilized to make the conventional memory array, a simplified voltage control of bit line BL, a simplified configuration, and a reduced time period for design can be achieved.

Figure 14:
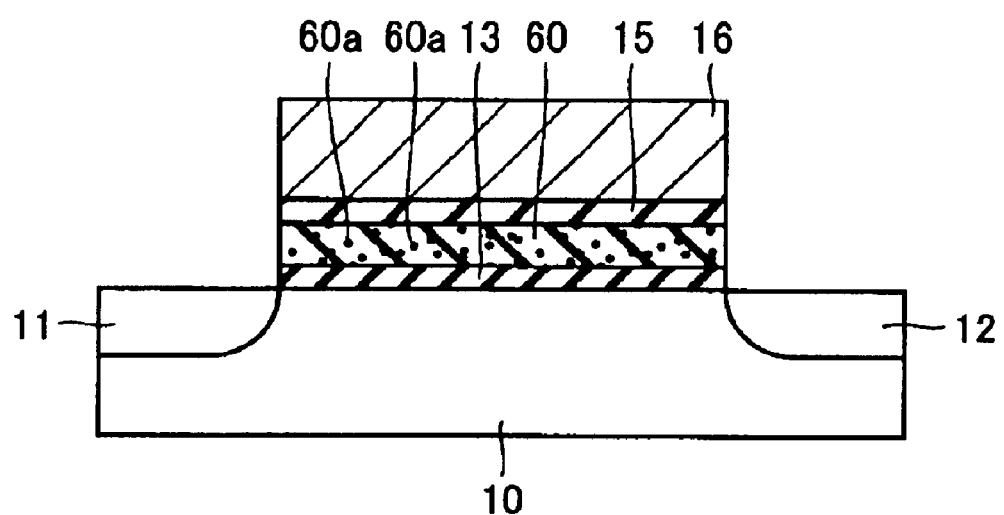
FIG. 14 is a cross-sectional view illustrating a variation of the present embodiment.

It is noted that memory cell MC shown in FIG. 4 can be replaced by a memory cell in FIG. 14 to achieve the same effect. The memory cell in FIG. 14 is memory cell MC in FIG. 4 with its $Si_3N_4$ film 14 replaced by an $SiO_2$ film 60 containing multiple grains of polysilicon 60a. The multiple grains of polysilicon 60a are dispersed and embedded in $SiO_2$ film 60.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device, comprising:

a plurality of memory cells arranged in a plurality of rows and a plurality columns, each including a semiconductor substrate, a first insulator layer, a charge trapping layer, a second insulator layer, and a gate electrode successively stacked on a surface of the semiconductor substrate, and source and drain respectively formed on the surface of said semiconductor substrate at one side and other side of said gate electrode;

a plurality of word lines respectively provided corresponding to said plurality of rows, each connected to the gate electrode of each corresponding memory cell;

a plurality of bit lines respectively provided corresponding to said plurality of columns, each connected to the drain of each corresponding memory cell;

a source line commonly connected to the sources of said plurality of memory cells; and a read circuit selecting any of said plurality of memory cells in accordance with an address signal and reading a data signal of the selected memory cell, said read circuit including
a first word line drive circuit applying a predetermined first potential to a word line corresponding to said selected memory cell while applying a ground potential to another word line,
a first bit line drive circuit applying a predetermined second potential to a bit line corresponding to said selected memory cell while applying a ground potential to other bit lines,
a first source line drive circuit applying the ground potential to said source line, and
a current detection circuit detecting whether or not a current flows through the bit line corresponding to said selected memory cell and outputting a data signal at a level corresponding to a detection result.

2. The nonvolatile semiconductor memory device according to claim 1, further comprising:

a write circuit selecting any of said plurality of memory cells in accordance with the address signal and injecting electrons to the charge trapping layer of the selected memory cell; wherein
said write circuit includes
a second word line drive circuit applying a predetermined third potential to a word line corresponding to said selected memory cell while applying the ground potential to other word lines,
a second bit line drive circuit applying the ground potential to a bit line corresponding to said selected memory cell while applying a predetermined fourth potential to other bit lines, and
a second source line drive circuit applying a predetermined fifth potential to said source line.

3. The nonvolatile semiconductor memory device according to claim 2, wherein
said fourth potential and said fifth potential are equal.

4. The nonvolatile semiconductor memory device according to claim 1, wherein
each of said first insulator layer and said second insulator layer is an oxide film layer, and said charge trapping layer is a nitride film layer.

5. The nonvolatile semiconductor memory device according to claim 1, wherein
each of said first insulator layer and said second insulator layer is an oxide film layer, and said charge trapping layer is an oxide film layer having multiple grains of silicon dispersed and embedded.

* * * * *